United States Patent [19]
Philippot et al.

[11] Patent Number: 5,929,642
[45] Date of Patent: Jul. 27, 1999

[54] METHOD OF LOCATING A FAULT IN A PREDETERMINED MONITORING REGION OF A MULTIPHASE ELECTRIC POWER TRANSMISSION SYSTEM

[75] Inventors: Luc Philippot; Zhihong Chen, both of Brüssel, Belgium

[73] Assignee: Siemens Aktiengesellschaft, Munich, Germany

[21] Appl. No.: 08/836,621

[22] PCT Filed: Nov. 6, 1995

[86] PCT No.: PCT/DE95/01594

§ 371 Date: Nov. 19, 1997

§ 102(e) Date: Nov. 19, 1997

[87] PCT Pub. No.: WO96/14585

PCT Pub. Date: May 17, 1996

[30] Foreign Application Priority Data

Nov. 8, 1994 [DE] Germany .................. 44 41 334

[51] Int. Cl.⁶ ............................................. G01R 31/02
[52] U.S. Cl. ............................................. 324/522; 702/35
[58] Field of Search ........................ 324/551, 522, 324/509, 541, 544; 702/64, 65; 361/80, 79

[56] References Cited

U.S. PATENT DOCUMENTS

| | | | |
|---|---|---|---|
| 4,559,491 | 12/1985 | Saha | 324/522 |
| 4,795,983 | 1/1989 | Crockett | 324/522 |
| 5,072,403 | 12/1991 | Johns | 324/522 |
| 5,399,974 | 3/1995 | Eriksson | 324/522 |
| 5,446,387 | 8/1995 | Eriksson | 324/522 |
| 5,572,138 | 11/1996 | Nimmersjo | 324/522 |
| 5,608,327 | 3/1997 | Jones et al. | 324/522 |

FOREIGN PATENT DOCUMENTS

| | | |
|---|---|---|
| 0 053 069 | 6/1982 | European Pat. Off. . |
| 0 106 790 | 4/1984 | European Pat. Off. . |
| 26 15 556 | 8/1977 | Germany . |

OTHER PUBLICATIONS

A.T. Johns et al., "Accurate fault location technique for power transmission lines," IEE Proceedings, vol. 137, Pt. C., No. 6, Nov. 1990, pp. 395–402.

Derwent Publications Ltd., Soviet Inventions Illustrated, Section EL: Electrical, Week 8737, Oct. 28, 1987, p. 22.

"New Accurate Transmission Line Fault Location Equipment", IEE Proceedings, Fourth Int'l Conference on Developments in Power System Protection, vol. 137, Pt. C, No. 5, Nov. 1990.

*Primary Examiner*—Maura Regan
*Attorney, Agent, or Firm*—Kenyon & Kenyon

[57] ABSTRACT

A method for locating a fault in an electric power transmission line to form measured precursor fault vector values of two aerial modes from sample values from currents and voltages stored immediately before and during an occurrence of the fault, using the Clarke transformation. For synchronization, the phase angle is determined from these measured vector values, so that fault vector voltage values of both aerial modes can be generated without distortion by asynchronously forming the sample values. The fault vector voltage values of one aerial mode are subtracted from those of the other aerial mode, and the resulting differences are squared. The location of the fault is determined by estimating the minimum value of the sum of the squared differences.

2 Claims, 3 Drawing Sheets

METHOD OF LOCATING A FAULT IN A PREDETERMINED MONITORING REGION OF A MULTIPHASE ELECTRIC POWER TRANSMISSION SYSTEM

It is general knowledge that a predetermined region of an electric power transmission line system, e.g., a section of a three-phase power transmission line, can be monitored for faults by providing a protective device at each end of the section of electric power transmission line. Each protective device is generally provided with a fault detector circuit that delivers a signal to activate the respective protective device when a fault occurs.

It is also known ("New accurate transmission line fault location equipment," IEE Conf. Publ. 302, 1989, pages 1–5) that currents and voltages can be stored at each end of a section of a multiphase electric power transmission line to be monitored in a method of locating a fault, where this is accomplished by determining values immediately before and during the occurrence of a fault. The stored values are sampled and processed further in different ways, depending on whether they are assigned to values stored before or during a fault.

As also stated in IEE Proceedings, vol. 137, pt. C, no. 6, November 1990, pages 395–402, for accurate location of a fault in a three-phase power transmission line by this known method, variables obtained by using the known Clarke transformation in the transition to modal values or functions are taken into account. At each end of a section of an electric power transmission line to be monitored, first the sampled values obtained from currents and voltages stored immediately before a fault occurs are taken into account, and measured precursor fault vector values of one aerial mode are formed from these sample values. The aerial mode is a mode which, in addition to another aerial mode and a ground-based mode is characteristic of the Clarke transformation. Using the measured precursor fault vector values, a phase angle is determined on the basis of asynchronous sampling at the two ends of the section of the power transmission line to be monitored between the measured precursor fault vector values. In the known method, which takes into account sample values calculated from currents and voltages stored during the fault, fault vector voltage values are calculated using the measured precursor fault vector values, with intermediate calculation of differential measured vector values; these fault vector voltage values are measured values indicating the voltage at the fault location, as considered in relation to both ends of the section of electric power transmission line to be monitored. Since the fault vector voltage values determined from both sides for the same fault location must be the same, this yields the possibility of calculating the location of the fault with a relatively high accuracy. However, the prerequisite is that the phases of the two fault vector voltage values must match. Since this is not the case with the known method, the phase angle is determined with the measured precursor fault vector values and a corresponding measured phase angle value is formed. This measured value is used for synchronization of the fault vector voltage values and only then is the location of the fault determined from the fault vector voltage values.

The known method is subject to some uncertainty in locating a fault inasmuch as complete diagonalization is impossible with a Clarke transformation. This is where the invention begins, by formulating the object of providing a method of locating a fault in a predetermined region of a multiphase electric power transmission line system with an especially high measurement accuracy.

This object is achieved according to this invention in a method of locating a fault in a predetermined monitoring region of a multiphase electric power transmission line system with the detection of voltages and currents of the phase conductors at the ends of the monitoring region, where measured values that are proportional to the currents and voltages and occur immediately before and during the fault at the ends of each monitoring region are stored; measured precursor fault vector values of one aerial mode and another aerial mode are formed by Clarke transformation from sample values formed from voltages and currents stored immediately before the occurrence of a fault; the measured precursor fault vector values of the different ends of the monitoring region are tested for their phase angle relative to each other and a measured phase angle value corresponding to the phase angle is formed; furthermore, fault vector voltage values of one aerial mode and the other aerial mode are formed from sample values obtained from currents and voltages stored when a fault occurs, taking into account the measured precursor fault vector values, and the fault vector voltage values of the one aerial mode are subtracted from those of the other, and the resulting differences are squared, and then the location of the fault is determined from an estimated minimum value of the sum of the squared differences.

The basic advantage of the method according to this invention is that by using the additional measured precursor fault vector values of an additional aerial mode in this method and the additional fault vector voltage values of the same additional aerial mode, it is possible to locate the fault by means of an estimate according to the least squares criterion, so the location of the fault can be determined with a comparatively high accuracy.

In the method according to this invention, deriving an accurate measured phase angle value is especially important because the measurement accuracy of the method according to this invention also depends on accurate determination of measured phase angle values. This is taken into account in an advantageous embodiment of the method according to this invention, whereby to obtain the measured phase angle value, precursor fault vector voltage values and precursor fault vector current values are formed from both aerial modes, the paired precursor fault vector voltage values and precursor fault vector current values of one aerial mode are subtracted from those of the other aerial mode, the resulting differences are squared, and the measured phase angle value is determined from an estimated minimum value for the sum of the squared differences.

The advantage of this embodiment of the method according to this invention is that differences are formed using not only precursor fault vector voltage values but also precursor fault vector current values, and after squaring these differences, they are also analyzed according to the least squares criterion, so the measured phase angle value can be determined with a high accuracy.

To further illustrate this invention:

Figure 1:
FIG. 1 shows a three-phase power transmission line with a section to be monitored.

According to FIG. 1, an electric power transmission line E has three phase conductors A, B and C. The electric power transmission line E extends between one end S and another end R. It has length L. At each end S and R of electric power transmission line E there is a protective device SE1 and SE2 that receives the currents in conductors A through C and the voltages on these phase conductors in a manner only indicated schematically here.

Each protective device SE1 and SE2 contains, e.g., a distance protection device (not shown) with a fault detector circuit (also not shown). Furthermore, each protective device SE1 and SE2 is equipped with a device (not shown in FIG. 1) for recording the currents in phase conductors A, B and C and the voltages in these phase conductors of electric power transmission line E.

Figure 2:
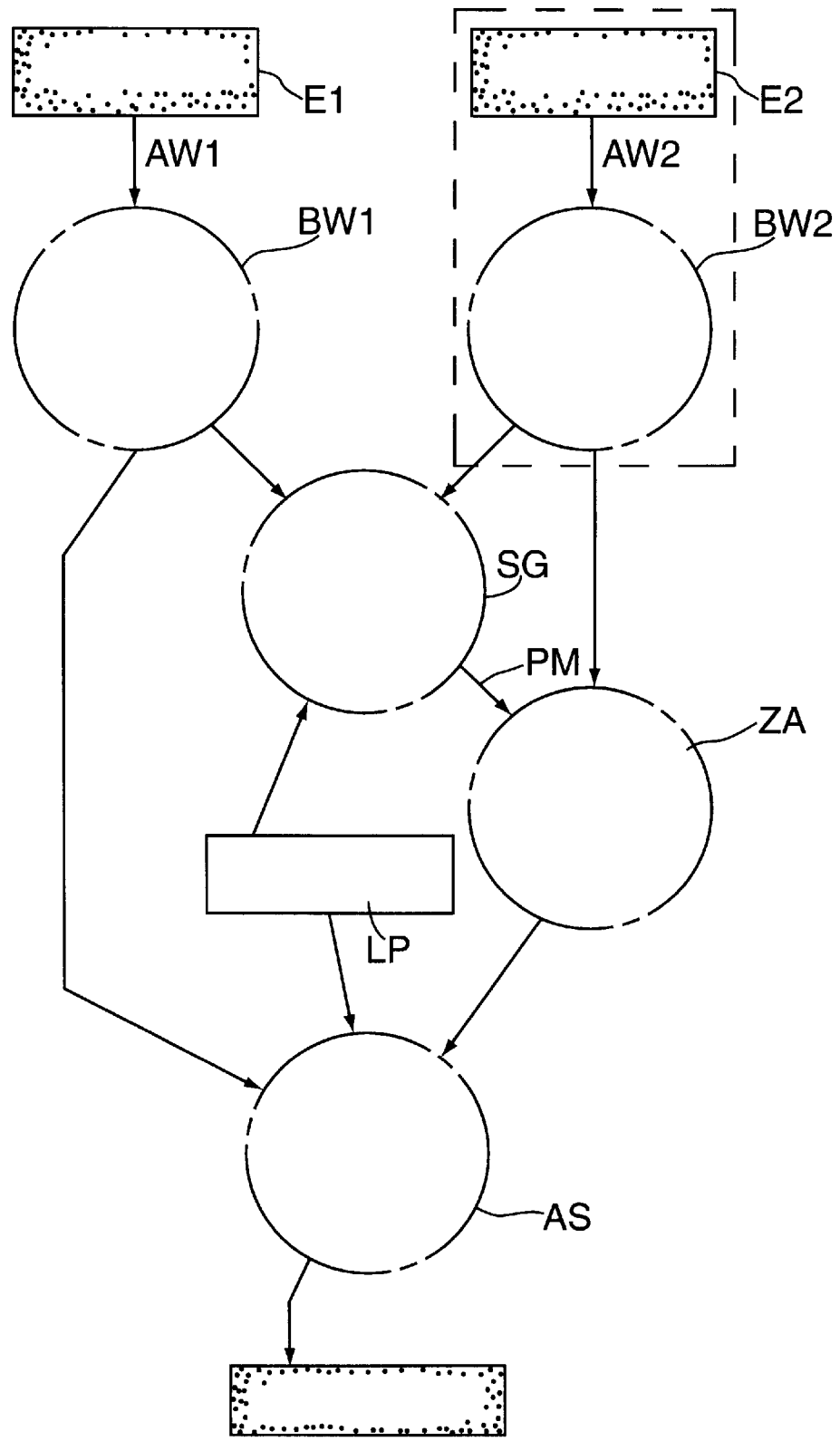
FIG. 2 shows a type of block schematic to illustrate the sequence in the method according to this invention.

As FIG. 2 shows, downstream from each of these devices E1 and E2 (diagramed only schematically) is a weighting network BW1 and BW2 to record the currents and voltages and receive sample values AW1 and AW2 after a fault occurs. Sample values AW1 and AW2 are formed by sampling the variations in the currents and voltages in conductors A through C of electric power transmission line E recorded immediately before and during a fault. Taking into account the known Clarke transformation, measured precursor fault vector values $V_{BF,m}^S$ and $I_{BF,m}^S$ as well as $V_{BF,m}^{R,async}$ and $I_{BF,m}^{R,async}$ are formed in weighting networks BW1 and BW2 as voltage- and current-based measured precursor fault vector values from sample values obtained immediately before a fault occurs. In this notation, m denotes one aerial mode ($\alpha$) or the other aerial mode ($\beta$) according to Clarke transformation. The letters S and R denote the respective ends of the power transmission line, while async indicates that the measured precursor fault vector values assigned to end R have not been synchronized with those of end S.

The resulting precursor fault measured values $V_{BF,m}^S$ and $I_{BF,m}^S$ as well as $V_{BF,m}^{R,async}$ and $I_{BF,m}^{R,async}$ are sent to an estimator SG where a measured phase angle value PM is determined. In this estimator SG, currents $I_m^S$ and $I_m^R$ as well as voltages $V_m^S$ and $V_m^R$ "coming" from the two ends S and R or from protective devices SE1 and SE2 and occurring at half the length L/2 of the line section monitored are calculated with the measured precursor fault vector values. These values can be described by the following equations:

$$V_m^S = \cosh\left(\gamma_m \cdot \frac{L}{2}\right) \cdot V_{BF,m}^S - Zc_m \cdot \sinh\left(\gamma_m \cdot \frac{L}{2}\right) \cdot I_{BF,m}^S \quad (1)$$

$$V_m^R = \cosh\left(\gamma_m \cdot \frac{L}{2}\right) \cdot V_{BF,m}^{R,async} \cdot e^{j\delta} + Zc_m \cdot \sinh\left(\gamma_m \cdot \frac{L}{2}\right) \cdot I_{BF,m}^{R,async} \cdot e^{j\delta} = 0 \quad (2)$$

$$I_m^S = Zc_m \cdot \cosh\left(\gamma_m \cdot \frac{L}{2}\right) \cdot I_{BF,m}^S - \sinh\left(\gamma_m \cdot \frac{L}{2}\right) \cdot V_{Bf,m}^S \quad (3)$$

$$I_m^R = Zc_m \cdot \cosh\left(\gamma_m \cdot \frac{L}{2}\right) \cdot I_{BF,m}^{R,async} \cdot e^{j\delta} - \sinh\left(\gamma_m \cdot \frac{L}{2}\right) \cdot V_{BF,m}^{R,async} \cdot e^{j\delta} = 0 \quad (4)$$

Since the currents and voltages must be the same at the assumed middle of the region of the power transmission line E to be monitored, the following equation (5) can be formulated for the voltages:

$$\varepsilon_{V_m} = \cosh\left(\gamma_m \cdot \frac{L}{2}\right) \cdot V_{BF,m}^S - Zc_m \cdot \sinh\left(\gamma_m \cdot \frac{L}{2}\right) I_{BF,m}^S - \quad (5)$$

-continued
$$\cosh\left(\gamma_m \cdot \frac{L}{2}\right) \cdot V_{BF,m}^{R,async} \cdot e^{j\delta} + Zc_m \cdot \sinh\left(\gamma_m \cdot \frac{L}{2}\right) \cdot I_{BF,m}^{R,async} \cdot e^{j\delta} = 0$$

A similar relation can be formulated for the currents, as shown by the following equation (6):

$$\varepsilon_{I_m} = Zc_m \cdot \cosh\left(\gamma_m \cdot \frac{L}{2}\right) \cdot I_{BF,m}^S - \sinh\left(\gamma_m \cdot \frac{L}{2}\right) \cdot V_{BF,m}^S + \quad (6)$$
$$Zc_m \cdot \cosh\left(\gamma_m \cdot \frac{L}{2}\right) \cdot I_{BF,m}^S \cdot e^{j\delta} - \sinh\left(\gamma_m \cdot \frac{L}{2}\right) \cdot V_{BF,m}^{R,async} \cdot e^{j\delta} = 0$$

Figure 3:
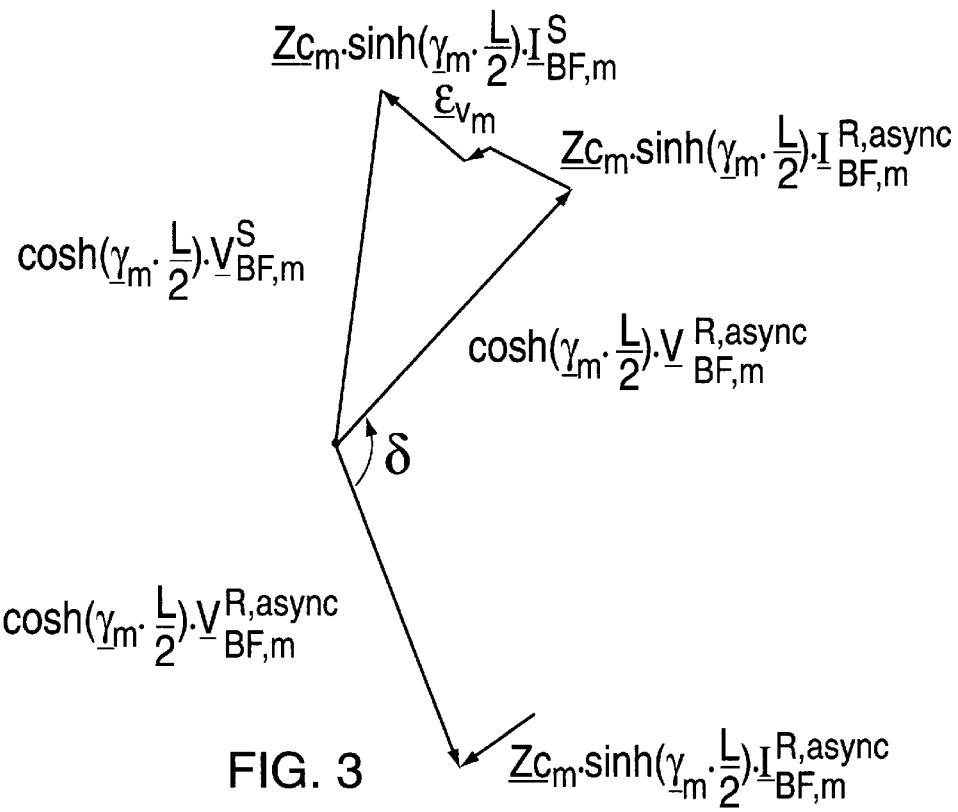
FIG. 3 shows a vector diagram to illustrate how the measured phase angle value is determined when voltage is taken into account.
Figure 4:
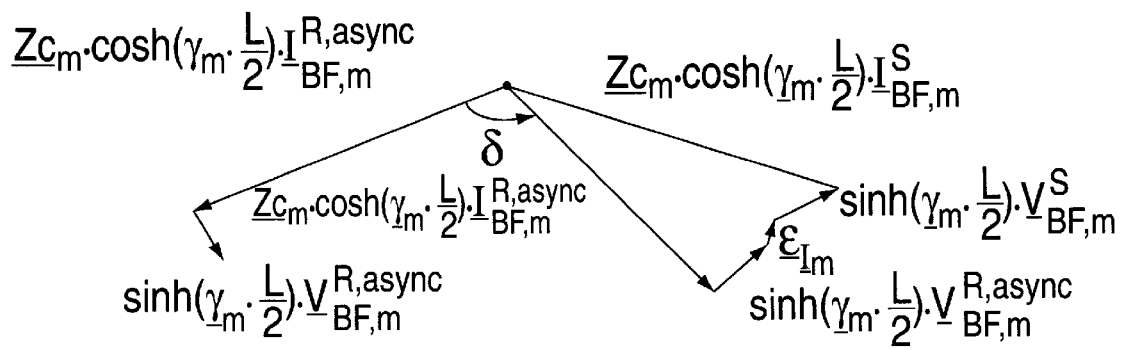
FIG. 4 shows a vector diagram corresponding to FIG. 3 where current is taken into account.

In equations (1) through (6), $Zc_m$ denotes the modal line impedance and $\gamma_m$ denotes the modal propagation constant according to the Clarke transformation; $\delta$ denotes the phase angle between paired measured precursor fault vector values. The variables $\varepsilon_{V_m}$ and $\varepsilon_{I_m}$ are fault variables. FIG. 3 illustrates the individual variables for the voltage relationships, and FIG. 4 shows the current relationships in graphic form.

To determine phase angle $\delta$ and measured phase angle value PM, the differences $\varepsilon_{V_m}$ and $\varepsilon_{I_m}$ are squared for both aerial modes $\alpha$ and $\beta$, yielding a one-dimensional cost function $K_f$ according to the following equation (7):

$$K_f = \left|\varepsilon_{V_\alpha}\right|^2 + \left|\varepsilon_{V_\beta}\right|^2 + \left|\varepsilon_{I_\alpha}\right|^2 + \left|\varepsilon_{I_\beta}\right|^2 \quad (7)$$

According to the least squares criterion, the cost function $K_f$ is minimized using the simplex method, which yields phase angle $\delta$ and measured phase angle value PM. The line parameters are supplied by block LP.

In addition to the measured precursor fault vector values, differential measured vector values $V_{SUP,m}^S$ and $V_{SUP,m}^{R,async}$ as well as $I_{SUP,m}^S$ and $I_{SUP,m}^{R,async}$ according to both aerial modes $\alpha$ and $\beta$ are formed by generating the difference between one measured vector value derived from sample values formed from voltages and currents stored during the fault (in both aerial modes) and the respective measured precursor fault vector values. Then the phases of the differential measured vector values formed by weighting network BW2 from the values at line end R are rotated according to the measured phase angle $\delta$ in an intermediate arrangement ZA; for this purpose, intermediate arrangement ZA receives measured phase angle value PM. Measured values $V_{SUP,m}^R$ and $I_{SUP,m}^R$ appear at the output of the intermediate arrangement.

Consequently, analyzing unit AS downstream from intermediate circuit ZA is supplied with differential measured vector values $V_{SUP,m}^R$ and $I_{SUP,m}^R$ which are synchronized with differential measured vector values $V_{SUP,m}^S$ and $I_{SUP,m}^S$ of weighting network BW1; this unit uses these differential measured vector values to form fault vector voltage values $V_{SUP,m}^{FfromS}$, $V_{SUP,m}^{FfromR}$ from the two ends S and R according to equations (8) and (9):

$$V_{SUP,m}^{F\,from\,S} = \cosh(\gamma_m \cdot x) \cdot V_{SUP,m}^S - Zc_m \cdot \sinh(\gamma_m \cdot x) \cdot I_{SUP,m}^S \quad (8)$$

$$V_{SUP,m}^{F\,from\,R} = \quad (9)$$
$$\cosh(\gamma_m \cdot (L-x)) \cdot V_{SUP,m}^R - Zc_m \cdot \sinh(\gamma_m \cdot (l-x)) \cdot I_{SUP,m}^R$$

Paired fault vector voltage values of one aerial mode $\alpha$ or $\beta$ are subtracted from those one another, forming differences $\varepsilon_{V_{m,SUP}}$ according to the following equation (10):

$$\varepsilon_{V_{m,SUP}} = \underline{V}_{SUP,m}^{F\,from\,S} - \underline{V}_{SUP,m}^{F\,from\,R} = 0 \qquad (10)$$

A one-dimensional cost function K is formed from the squares of the differences according to equation (11) below, which is analyzed according to the least error squares criterion.

$$K(\chi) = |\underline{\varepsilon}V_{\alpha,SUP}|^2 + |\underline{\varepsilon}_{\beta,SUP}|^2 \qquad (11)$$

Figure 5:
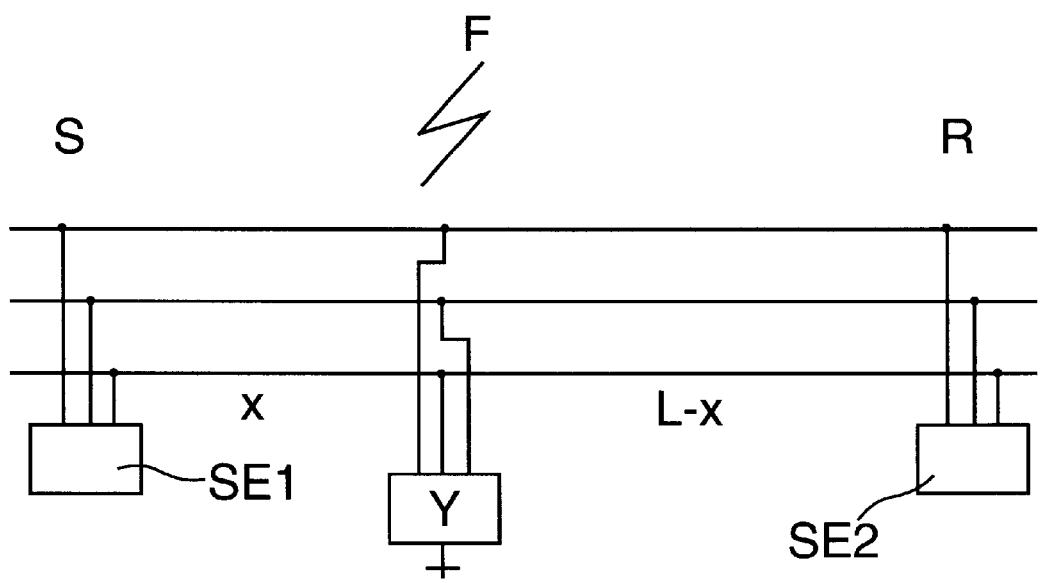
FIG. 5 shows the region of a power transmission line to be monitored with a fault.

Then the position x of a fault F on transmission line E can be determined with a high accuracy (see FIG. 5).

Equations (8) and (9) describe the relationships approximately. In an accurate analysis with partial coupling compensation, the following equation (12), for example, is obtained for the fault vector voltage value $\underline{V}_{SUP,m}^{F\,from\,S}$:

$$\underline{V}_{SUP,m}^{F\,from\,S} = \qquad (12)$$
$$\cosh(\underline{\gamma}_m \cdot x) \cdot \underline{V}_{SUP,m}^S - \underline{Zc}_m \cdot \sinh(\underline{\gamma}_m \cdot x) \cdot I_{SUP,m}^S - j \cdot M_{m,0}.$$

In this equation (12), m denotes one aerial mode and m' denotes the other aerial mode; $j \cdot M_{m,0} \cdot x$ denotes the reactance between the measurement location and the fault location, while equ indicates that the current is integrated from the measurement location to the fault location.

The fault vector voltage values corrected in this way are analyzed according to equations (10) and (11).

A further increase in accuracy in locating a fault can be achieved with the method according to this invention by performing a fault estimate with regard to the inductances of the power transmission line. In this case, predetermined inductance values per unit of length of power transmission line are assumed, and the fact that the cost function according to equation (7) now depends not only on phase angle δ but also on inductance values $l_m$, where m=α or β according to Clarke transformation of the power transmission line, is also taken into account. Again in this case, a minimization is performed according to the simplex method, beginning with the solution for phase angle δ and the predetermined inductance values.

Once $l_m$ has been determined, the variables $\underline{Zc}_m$ and $\gamma_m$ can be determined according to the following equations (13) and (14):

$$\underline{Zc}_m = \sqrt{\frac{r_m + j \cdot \omega \cdot l_m}{j \cdot \omega \cdot c_m}} \qquad (13)$$

$$\underline{\gamma}_m = \sqrt{(r_m + j \cdot \omega \cdot l_m) \cdot (j \cdot \omega \cdot c_m)} \qquad (14)$$

where $r_m$ and $c_m$ denote, respectively, the resistive and capacitive line parameters per unit of length according to Clarke. The values $\underline{Zc}_m$ and $\gamma_m$ thus obtained are entered into equations (8) and (9) and then location x of fault F is determined accurately according to equations (10) and (11).

What is claimed is:

1. A method for locating a fault in a predetermined monitoring region of a multiphase electric power transmission line system, the method comprising the steps of:

measuring first currents and voltages of phase conductors at end sections of the predetermined monitoring region, the measured first currents and voltages occuring immediately before and during the fault;

storing first measured values proportional to the measured first currents and voltages;

forming first sampled values according to a Clarke transformation immediately before the fault occurs;

forming measured precursor fault vector values of a first aerial mode and of a second aerial mode as a function of the sampled values for each of the ends of the predetermined monitoring region;

testing the measured precursor fault vector values of the ends of the predetermined monitoring region;

determining a measured phase angle value by:
  (a) forming second currents and voltages occurring at approximately a midpoint of the predetermined monitoring region as a function of the measured precursor fault vector values for the first aerial mode,
  (b) forming third currents and voltages occurring at approximately a midpoint of the predetermined monitoring region as a function of the measured precursor fault vector value for the second aerial mode,
  (c) subtracting the second currents and voltages from the third currents and voltages to generate first resultant differences,
  (d) squaring the first resulting differences, and
  (e) obtaining the measured phase angle value as a function of a first estimated minimum value of a sum of the squared first resultant differences, forming voltage-based and current-based differential measured vector values that are synchronized for each of the first and second aerial modes and for each end of the predetermined monitoring region as a function of the sample values, the measured phase angle values and the measured second precursor fault vector values;

determining a first fault vector voltage value as a function of the synchronized differential measured vector values for the first aerial mode and for each of the two ends of the predetermined monitoring region;

determining a second fault vector voltage value as a function of the synchronized differential measured vector values for the second aerial mode and for each of the two ends of the predetermined monitoring region;

subtracting the first fault vector voltage value from the second fault vector voltage value to provide second resulting differences;

squaring the second resulting differences; and determining the location of the fault as a function of a second estimated minimum of the sum of the squared second resulting differences.

2. The method according to claim 1, further comprising the step of:

after the step of determining the measured phase angle value, estimating measured inductance values of the first and second aerial modes as a function of predetermined inductance values of the power transmission system, wherein the first and second fault vector voltage values are determined as a further function of the measured inductance values.

* * * * *